(12) United States Patent
Fujimura

(10) Patent No.: US 8,404,404 B2
(45) Date of Patent: Mar. 26, 2013

(54) METHOD AND SYSTEM FOR MANUFACTURING A SURFACE USING CHARACTER PROJECTION LITHOGRAPHY WITH VARIABLE MAGNIFICATION

(75) Inventor: Akira Fujimura, Saratoga, CA (US)

(73) Assignee: D2S, Inc., San Jose, CA (US)

( * ) Notice: Subject to any disclaimer, the term of this patent is extended or adjusted under 35 U.S.C. 154(b) by 248 days.

(21) Appl. No.: 12/860,814

(22) Filed: Aug. 20, 2010

(65) Prior Publication Data

US 2011/0045409 A1 Feb. 24, 2011

Related U.S. Application Data

(60) Provisional application No. 61/236,050, filed on Aug. 21, 2009.

(51) Int. Cl.
  *G03F 1/20* (2012.01)
  *G06F 17/50* (2006.01)
(52) U.S. Cl. ............ 430/5; 430/30; 430/296; 430/942; 716/53
(58) Field of Classification Search ............ 430/5, 30, 430/296, 942; 716/53
  See application file for complete search history.

(56) References Cited

U.S. PATENT DOCUMENTS

| | | | |
|---|---|---|---|
| 6,630,681 B1 | 10/2003 | Kojima | |
| 7,754,401 B2 | 7/2010 | Fujimura et al. | |
| 7,759,026 B2 | 7/2010 | Fujimura et al. | |
| 2002/0163628 A1 | 11/2002 | Yui et al. | |
| 2004/0000649 A1 | 1/2004 | Yasuda et al. | |
| 2010/0055587 A1 | 3/2010 | Fujimura et al. | |

OTHER PUBLICATIONS

Hattori, K. et al., "Electron Beam Direct Writing System EX-8D Employing Character Projection Exposure Method", Journal of Vacuum Science Technology, vol. B11(6) (1993), pp. 2346-2351, 1993, American Vacuum Society, 125 Maiden Lane, 15th Floor, New York, NY 10038.

Nakasugi, T. et al. "Maskless Lithography Using Low Energy Electron Beam: Recent Results of Proof-of-Concept Tool", Journal of Vacuum Science Technology, vol. B20(6) (2002), pp. 2651-2656, American Vacuum Society, 125 Maiden Lane, 15th Floor, New York, NY 10038.

International Search Report and Written Opinion dated Dec. 3, 2010 for PCT/US2010/046239.

*Primary Examiner* — Christopher Young
(74) *Attorney, Agent, or Firm* — The Mueller Law Office, P.C.

(57) ABSTRACT

A character projection charged particle beam writer system is disclosed comprising a variable magnification reduction lens which will allow different shot magnifications on a shot by shot basis. A method for fracturing or mask data preparation or optical proximity correction is also disclosed comprising assigning a magnification to each calculated charged particle beam writer shot. A method for forming a pattern on a surface is also disclosed comprising using a charged particle beam writer system and varying the magnification from shot to shot. A method for manufacturing an integrated circuit using optical lithography is also disclosed, comprising using a charged particle beam writer system to form a pattern on a reticle, and varying the magnification of the charged particle beam writer system from shot to shot.

12 Claims, 4 Drawing Sheets

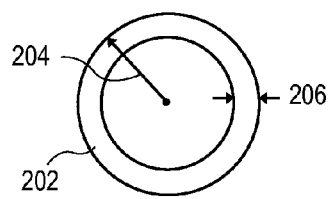
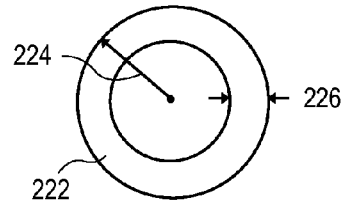
FIG. 2A     FIG. 2B
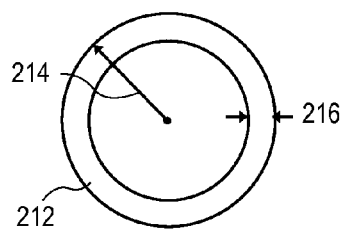
FIG. 2C
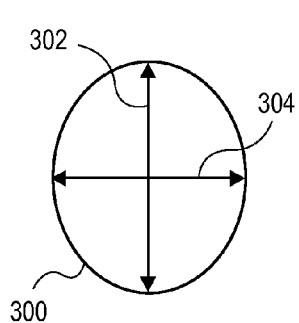
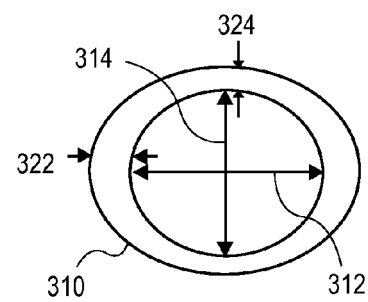
FIG. 3A     FIG. 3B

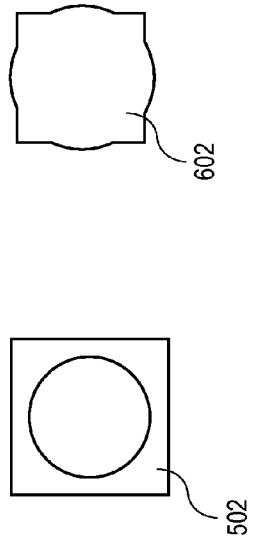
FIG. 5
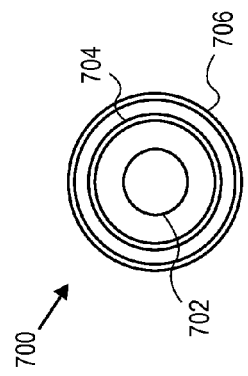
FIG. 6
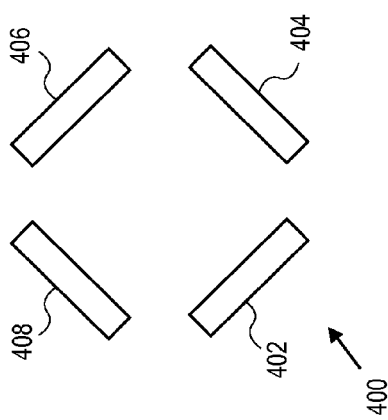
FIG. 4
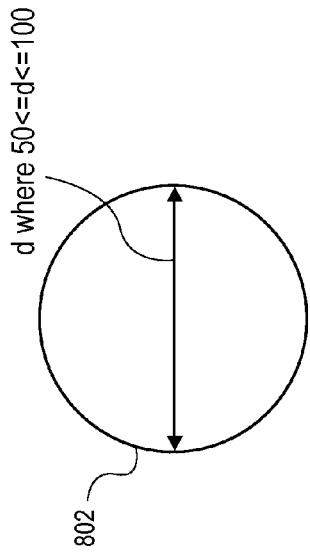
FIG. 8
FIG. 7

METHOD AND SYSTEM FOR MANUFACTURING A SURFACE USING CHARACTER PROJECTION LITHOGRAPHY WITH VARIABLE MAGNIFICATION

RELATED APPLICATIONS

This application claims priority from U.S. Provisional Patent Application Ser. No. 61/236,050, filed Aug. 21, 2009, entitled "Method and System For Manufacturing a Surface Having Variable Sized Patterns Using Character Projection Lithography"; which is hereby incorporated by reference for all purposes.

BACKGROUND OF THE DISCLOSURE

The present disclosure is related to lithography, and more particularly to the design of a charged particle beam writer system and methods for using the charged particle beam writer system to manufacture a surface which may be a reticle, a wafer, or any other surface.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit. Other substrates could include flat panel displays or even other reticles. Also, extreme ultraviolet (EUV) or X-ray lithography are considered types of optical lithography. The reticle or multiple reticles may contain a circuit pattern corresponding to an individual layer of the integrated circuit and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms or magnetic recording heads.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms or magnetic recording heads.

As indicated, in optical lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of predetermined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce on the substrate the original circuit design by use of the reticle. Integrated circuit fabricators are always attempting to use the semiconductor wafer real estate as efficiently as possible. Engineers keep shrinking the size of the circuits, either allowing an integrated circuit with the same number of circuit elements to be smaller and use less power, or allowing an integrated circuit of the same size to contain more circuit elements. As the size of an integrated circuit critical dimension is reduced and its circuit density increases, the critical dimension of the circuit pattern or physical design approaches the resolution limit of the optical exposure tool used in optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on a corner of a pattern to sharpen the corner in the final transferred image. It is often the case that the precision demanded of the surface manufacturing process for SRAFs is less than that for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the main features on the mask.

Inverse lithography technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the surface as input. ILT-computed reticle patterns may be purely curvilinear—i.e. completely non-rectilinear—and may include circular, nearly circular, annular, nearly annular, oval and/or nearly oval patterns. Since curvilinear patterns are difficult and expensive to form on a reticle using conventional techniques, rectilinear approximations of the curvilinear patterns may be used. In this disclosure ILT, OPC, source mask optimization (SMO), and computational lithography are terms that are used interchangeably.

As the minimum feature size decreases along Moore's Law, and especially as features with dimensions less than 50 nm on the substrate are formed using optical lithography with a 193 nm illumination source with immersion technology, the OPC features on a photomask become very complex in shape. Specifically, it will not be practical to limit the shapes on a reticle to orthogonal and rectilinear shapes and still achieve a wafer fabrication process window sufficient to produce an acceptable process yield.

There are a number of technologies used for forming patterns on a reticle, including using optical lithography or charged particle beam systems. The most commonly used system is the variable shape beam (VSB) type, where a precise electron beam is shaped and steered onto a resist-coated surface of the reticle. These shapes are simple shapes, usually limited to rectangles of certain minimum and maximum sizes and triangles with their three internal angles being 45 degrees, 45 degrees, and 90 degrees of certain minimum and maximum sizes. At pre-determined locations, doses of electrons are shot into the resist with these simple shapes. The total writing time for this type of system increases with the number of shots. A second type of system is a character projection system, referred to as CP in this disclosure. In this case there is a stencil in the system that has in it a variety of shapes which may be rectilinear, arbitrary-angled linear, circular, annular, part circular, part annular, or arbitrary curvilinear shapes, and may be a connected set of complex shapes or a group of disjointed sets of a connected set of complex shapes. An electron beam can be shot through the stencil to efficiently produce more complex patterns (i.e. CP characters, sometimes referred to as characters) on the reticle. In theory, such a system could be faster than a VSB system because it can shoot more complex shapes with each time-consuming shot. Thus, an E shot with a VSB system takes four shots, but could be done with one shot with a character projection system. Note that shaped beam systems can be thought of as a special (simple) case of character projection, where the characters are just simple characters, usually rectangles or 45-45-90 triangles. It is also possible to partially expose a character. This can be done by, for instance, blocking part of the particle beam. For example, the E described above can be partially exposed as an F or an I, where different parts of the beam are cut off by an aperture. For a very complex reticle, one must fracture the pattern into nearly billions and sometimes approaching trillions of elemental shapes. There are, for instance, simple rectangular shapes for a VSB system or a limited number of characters in a character projection system. The more total instances of elemental shapes (characters) in the pattern, the longer and more expensive the write time. However, for writing surfaces such as an OPC-decorated reticle where there are numerous fine variations among even the smaller patterns, such projection systems are today impractical. The number of characters that can be made available among which the selection of characters by the projection machine takes minimal time is limited, today only allowing about 10-1000 characters. When faced with the plethora of slightly varying OPC patterns that are required to be placed on a reticle, no system or method has been available which can accomplish this task.

Thus, it would be advantageous to reduce the time and expense it takes to prepare and manufacture a reticle that is used for a substrate. More generally, it would be advantageous to reduce the time and expense it takes to prepare and manufacture any surface. Toward this goal, it would also be desirable to maximize the number of patterns that can be written to the surface using CP characters, the available set of which is limited in size. Thus, there exists a need for a charged particle beam writer system and method for manufacturing a surface that eliminates the foregoing problems associated with preparing a surface.

SUMMARY OF THE DISCLOSURE

A character projection charged particle beam writer system is disclosed comprising a variable magnification reduction lens which will allow different magnifications on a shot by shot basis.

A method for fracturing or mask data preparation or optical proximity correction is also disclosed comprising assigning a magnification to each calculated charged particle beam writer shot.

A method for forming a pattern on a surface is also disclosed comprising using a charged particle beam writer system and varying the magnification from shot to shot.

A method for manufacturing an integrated circuit using optical lithography is also disclosed, comprising using a charged particle beam writer system to form a pattern on a reticle, and varying the magnification of the charged particle beam writer system from shot to shot.

These and other advantages of the present disclosure will become apparent after considering the following detailed specification in conjunction with the accompanying drawings.

BRIEF DESCRIPTION OF THE DRAWINGS

FIG. 2A illustrates an annular pattern;

FIG. 2B illustrates another annular pattern having a thickness greater than the pattern of FIG. 2A;

FIG. 2C illustrates another annular pattern which is similar to the pattern of FIG. 2A but which is larger in overall size;

FIG. 3A illustrates an elliptical pattern;

FIG. 3B illustrates an elliptical annular pattern;

FIG. 4 illustrates a set of four rectangles arranged in a sub-resolution assist feature (SRAF) configuration;

FIG. 5 illustrates a pattern consisting of a square with an enclosed circular hole;

FIG. 6 illustrates a pattern consisting of the union of a circle and a square;

FIG. 7 illustrates a complex pattern consisting of a circle surrounded by two concentric annuli;

FIG. 8 illustrates a circular pattern that can be created on a surface using a parameterized glyph.

DETAILED DESCRIPTION OF THE EMBODIMENTS

Figure 1:
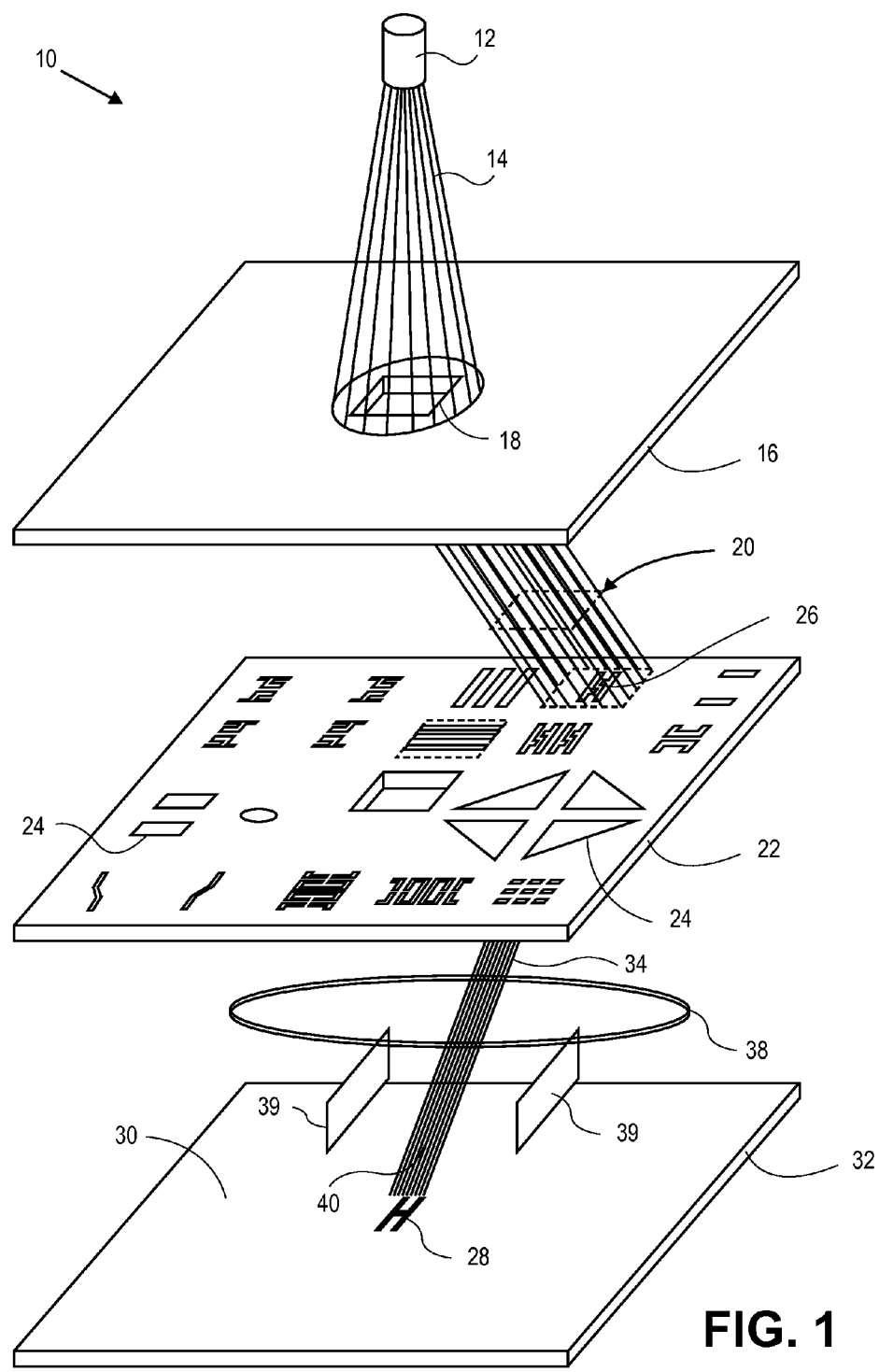
FIG. 1 illustrates a character projection charged particle beam writer system used to manufacture a surface.

The improvements and advantages of the present disclosure can be accomplished by use of a charged particle beam writer system in which the de-magnification can be adjusted for each shot, and by creating and using a shot list which contains a magnification for each shot.

Referring now to the drawings, wherein like numbers refer to like items, number 10 identifies an embodiment of a lithography system, such as a particle beam writer system, in this case an electron beam writer system, that employs character projection to manufacture a surface 30. The electron beam writer system 10 has an electron beam source 12 that projects an electron beam 14 toward an aperture plate 16. The plate 16 has an aperture 18 formed therein which allows the electron beam 14 to pass. Once the electron beam 14 passes through the aperture 18 it is directed or deflected by a system of lenses (not shown) as electron beam 20 toward another rectangular aperture plate or stencil mask 22. The stencil 22 has formed therein a number of openings or apertures 24 that define various types of characters 26. Each character 26 formed in the stencil 22 may be used to form a pattern 28 on a surface 30 of a substrate 32, such as a silicon wafer, a reticle or other substrate. In partial exposure, partial projection, partial character projection, or variable character projection, electron beam 20 may be positioned so as to strike or illuminate only a portion of character 26, thereby forming a pattern 28 that is a subset of character 26. An electron beam 34 emerges from one of the characters 26 and passes through an electronic reduction lens 38 which reduces the size of the pattern from the character 26. In commonly available charged particle beam writer systems, the reduction factor is between 10 and 60. The reduced electron beam 40 emerges from the reduction lens 38, and is directed by a series of deflectors 39 onto the surface 30 as the pattern 28, which is depicted as being in the shape of the letter "H". The pattern 28 is a reduced in size compared to the character 26 because of the reduction lens 38. The pattern 28 is drawn by using one shot of the electron beam system 10. This reduces the overall writing time to complete the pattern 28 as compared to using a variable shape beam (VSB) projection system or method. Although one aperture 18 is shown being formed in the plate 16, it is possible that there may be more than one aperture in the plate 16. Although two plates 16 and 22 are shown in this example, there may be only one plate or more than two plates each plate comprising one or more apertures. In conventional charged particle beam writer systems the reduction lens is calibrated to provide a fixed reduction factor.

FIG. 7 illustrates an example of an ILT-generated pattern 700, such as a pattern for a contact or via for an integrated circuit. A primary circular or nearly-circular shape 702 is surrounded by two annular or nearly-annular sub-resolution assist features (SRAF), annulus 704 and annulus 706. In this disclosure, circular, circle, cylinder, cylindrical, annular, and annulus are used to describe nearly-circular, near-circle, near-cylinder, nearly-cylindrical, nearly-annular and near-annulus respectively including their plural forms. An integrated circuit pattern may have hundreds of thousands or millions of contact or via patterns. However, the sizes of the circle 702, the annulus 704 and/or the annulus 706 may be slightly different among the millions of patterns. Also, the thickness of the annulus 704 and the annulus 706 may vary. Using VSB technology to transfer pattern 700 to a surface would require a large number of VSB shots, because of the curvilinear nature of the pattern 700. Ideally, the entire pattern 700 would be shot using one or a few CP shots. The many variations of the pattern, however, would overflow the available capacity of a stencil. To make use of CP practical for exposing this pattern in large numbers on a surface, one or a few CP characters must be able to shoot a variety of sizes of shapes 702, 704 and 706, and also a variety of thicknesses of annuli 704 and 706.

FIGS. 2A-C illustrate two types of variations for an annular pattern. FIG. 2A illustrates an annular pattern 202 having an outer radius 204 and a thickness 206. FIG. 2B illustrates an annular pattern 222 similar to 202. Pattern 222 has an outer radius 224 and a thickness 226. In particular, thickness 226 is greater than thickness 206. The outer radius 224 of pattern 222 is also greater than the outer radius 204 of pattern 202.

Specifically, the difference of outer radius 224 minus outer radius 204 is one-half the difference of thickness 226 minus thickness 206. The larger outer radius of annulus 222 compared to annulus 202 is therefore due to the increase in thickness 226 over thickness 206, and not due to a change of magnification. Prior disclosures, such as Fujimura (U.S. Pat. No. 7,759,026) have disclosed a method for varying the width of a line by varying the shot dosage. This technique may be applied to FIG. 2A & FIG. 2B patterns. Specifically, dosage variation may be used to form annulus 202 and annulus 222 on a surface using a single CP character.

FIG. 2C illustrates an annulus 212 with an outer radius 214 and a thickness 216. Annulus 212 is scaled or magnified compared to annulus 202. In other words, the ratio of outer radius 214 to outer radius 204 is the same as the ratio of thickness 216 to thickness 206. Variable scaling is not possible in a conventional charged particle beam writer system, because the reduction lens 38 has a fixed calibrated reduction ratio or factor—typically between 10 and 60. By contrast, one embodiment of the current invention is a charged particle beam writer system in which the reduction lens 38 is able to reduce the pattern 26 by a variable ratio which can be specified separately for each shot. Magnification variation refers to the ability of the reduction lens 38 to change or vary its magnification from shot to shot. The design of the reduction lens 38 may be electrostatic, electromagnetic, or a combination of electrostatic and electromagnetic. The reduction lens 38 may consist of a single set of plates or coils, or of multiple sets of plates and/or coils, which may be of different sizes. In one embodiment, a particular subset of plates and/or coils may be primarily or only for the fine-level control of magnification variations. Similarly, a subset of plates and/or coils may be primarily or only for the large-level control of magnification variation. In one embodiment the charged particle beam writer system may be capable of different magnification variations for the X-axis and Y-axis of a Cartesian plane. In another embodiment the magnification variation may comprise the ability to vary the magnification in multiple axes that are other than 90 degrees apart, such as 45 degrees. In another embodiment, there may be multiple magnifications which are individually calibrated. In yet another embodiment, the charged particle beam writer system may interpolate when magnifying to a factor between points of calibration, the interpolation using linear, quadratic or another technique. Because the precision requirement for the SRAFs is often less than that for main features, and because the curvilinear SRAFs typically would require many more VSB shots than for main feature without CP, the use of CP characters, including those from partial projection, are particularly attractive for SRAFs. Main features can also be projected using magnification variation. Hence annulus 212 may be an SRAF or a main feature. Using partial projection, a part of annulus 212 may be projected as one CP shot on the surface, each such part being subject to magnification variation, vastly increasing the number of shapes that can be projected from a CP character containing annulus 212.

Referring again to FIG. 2A and FIG. 2C, as previously indicated, the thickness 216 of annulus 212 is larger than the thickness 206 of annulus 202. By reducing the charged particle beam writer dosage when shooting annulus 212 compared to the dosage of annulus 202, thickness 216 may be reduced to be closer to or the same as thickness 206. The combination of magnification variation with dosage modification allows varying the size of a pattern or shape such as annulus 202 without changing the width of the pattern or shape, such as the thickness of annulus 202. One skilled in the art will recognize that other methods of CP shot modification and/or partial projection known in the art can be combined with the magnification variation of the present disclosure to form a large variety of patterns using one or a few CP characters.

FIG. 3A illustrates an example of an elliptical pattern 300, such as may be output from ILT OPC processing. Pattern 300 has a major diameter 302 and a minor diameter 304, such that the major diameter 302 is greater than the minor diameter 304. Expressed another way, pattern 300 is longer in the Y-direction of the Cartesian plane than in the X-direction. Pattern 300 can be formed on a surface by using a charged particle beam writer system of the current disclosure, using one shot of a circular CP character, by specifying a Y-axis magnification greater than the X-axis magnification. Similarly, nearly elliptical patterns may be formed on a surface from nearly circular CP characters.

FIG. 3B illustrates an example of an elliptical annular pattern 310. The interior dimension of the pattern 310 is 312 in the X-dimension and 314 in the Y-dimension, where the X-dimension 312 is greater than the Y-dimension 314 in this example. Pattern 310 may be formed on a surface using a charged particle beam writer system of the current disclosure and an annular CP character, by specifying an X-magnification factor greater than the Y-magnification factor. Note that because of the different scaling in X and Y dimensions, the thickness of the pattern 310 is not constant. Rather, the thickness 322 near the X-axis is greater than the thickness 324 near the Y-axis. Similarly, patterns which are nearly-elliptical annular may be formed using CP characters which are nearly circular. Elliptical or nearly-elliptical annular patterns such as pattern 310 may be output from ILT OPC processing.

FIG. 4 illustrates an example of a set of four rectangles 400 which are angled at 45 degree angles with respect to the X,Y axis of the Cartesian plane. The set 400 consists of rectangle 402, rectangle 404, rectangle 406 and rectangle 408. This relative formation of rectangles may be output as an SRAF by OPC processing, and may be output in various slightly-different sizes. Using a charged particle beam writer system of the current disclosure, a single CP character containing this set of four rectangles may be used to shoot this four-rectangle SRAF in a variety of sizes by varying the magnification of the charged-particle beam.

FIGS. 5 and 6 illustrate other types of patterns that may be output from OPC processing in a plurality of sizes. FIG. 5 illustrates a pattern 502 which consists of a circular hole within a square. FIG. 6 illustrates a pattern 602 which is the union of a circle and a square. Using a charged particle beam writer system of the current disclosure, pattern 502 can be written in a plurality of sizes using only a single CP character by varying the magnification of the charged-particle beam. Similarly, pattern 602 can be written in a plurality of sizes using only a single CP character by varying the magnification of the charged-particle beam. By using different X-axis and Y-axis magnifications, a pattern which is the union of an ellipse and a rectangle can be written using the same CP character as is used for pattern 602.

Two-dimensional maps of dosages known to be generated on a surface by single charged particle beam shots or combinations of charged particle beam shots are called glyphs. Each glyph may have associated with it the position and shot dosage information for each of the charged particle beam shots comprising the glyph. A library of glyphs may be pre-computed and made available to fracturing or mask data preparation functions. Glyphs may also be parameterized. FIG. 8 illustrates an example of a circular pattern on a surface which represents a set of patterns that can be formed by a parameterized glyph. The parameter of the glyph 802 is its diameter "d", where "d" may be any value between 50 and 100 units. In one embodiment, the glyph may be calculated using one or more circular CP characters, using different shot magnifications to change the size of the pattern formed on the surface. Magnification variation may be combined with other known techniques of CP shot modification, including dosage variation and shot overlap, to create glyphs.

Figure 9:
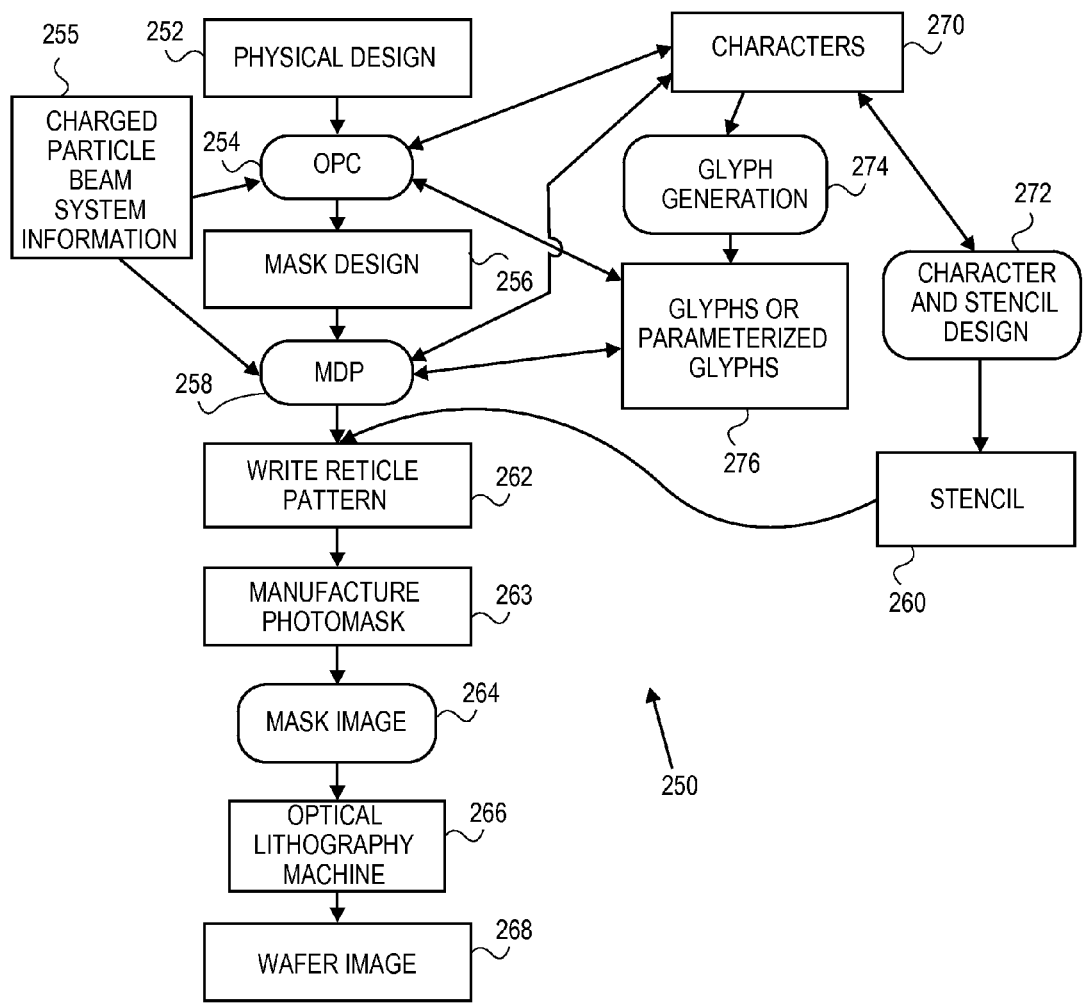
FIG. 9 illustrates an embodiment of a conceptual flow diagram of how to prepare a surface for use in fabricating a substrate such as an integrated circuit on a silicon wafer.

FIG. 9 is an exemplary conceptual flow diagram 250 of how to prepare a reticle for use in fabricating a surface such as an integrated circuit on a silicon wafer. In a first step 252, a physical design, such as a physical design of an integrated circuit, is designed. This can include determining the logic gates, transistors, metal layers, and other items that are required to be found in a physical design such as that in an integrated circuit. Next, in a step 254, optical proximity correction is (OPC) determined. In an embodiment of this disclosure this can include taking as input a library of pre-calculated glyphs or parameterized glyphs 276. This can also alternatively, or in addition, include taking as input a library of pre-designed CP characters 270 including complex characters that are to be available on a stencil 260 in a step 262. In another embodiment of this disclosure, an OPC step 254 may also include simultaneous optimization of shot count or write times, and may also include a fracturing operation, a shot placement operation, a dose assignment operation, or may also include a shot sequence optimization operation, or other mask data preparation operations. In this embodiment, OPC step 254 may use charged particle beam writer system information 255, which may include the range of magnifications which are available. Once optical proximity correction is completed a mask design is developed in a step 256. Then, in a step 258, a set of shots is determined in a mask data preparation (MDP) operation which may include a fracturing operation, a shot placement operation, a dose assignment operation, or a shot sequence optimization may take place. Either of the steps of the OPC step 254 or of the MDP step 258, or a separate program independent of these two steps 254 or 258 can include a program for determining a limited number of stencil characters that need to be present on a stencil or a large number of glyphs or parameterized glyphs that can be shot on the surface with a small number of shots by combining characters that need to be present on a stencil with varying dose, position, and degree of partial exposure to write all or a large part of the required patterns on a reticle. It is to be understood throughout this disclosure that the mask data preparation step 258 does not include OPC. Combining OPC and any or all of the various operations of mask data preparation in one step is contemplated in this disclosure. Mask data preparation step 258 may include a fracturing operation, and may also comprise a pattern matching operation to match glyphs to create a mask that matches closely to the mask design. Mask data preparation may also comprise inputting patterns to be formed on a surface with the patterns being slightly different, selecting a set of characters to be used to form the number of patterns, the set of characters fitting on a stencil mask, and the set of characters based on varying character dose or varying character position or varying the character magnification or applying partial exposure of a character within the set of characters to reduce the shot count or total write time. A set of slightly different patterns on the surface may be designed to produce substantially the same pattern on a substrate. Also, the set of characters may be selected from a predetermined set of characters. Mask data preparation step 258 may also include taking as input information about the charged particle beam writer, such as the range or discrete values of magnifications available. In one embodiment of this disclosure, a set of CP characters to be made available on a stencil so that characters in the set may be selected quickly during the mask writing step 262 may be prepared for a specific mask design in step 272 and put into a CP character library 270. In that embodiment, once the mask data preparation step 258 is completed, a stencil is prepared in a step 260. In another embodiment of this disclosure, a stencil is prepared in the step 260 prior to or simultaneous with the MDP step 258 and may be independent of the particular mask design. In this embodiment, the characters available in the CP character library 270 and the stencil layout are designed in step 272 to output generically for many potential mask designs 256 to incorporate slightly different patterns that are likely to be output by a particular OPC program 254 or a particular MDP program 258 or particular types of designs that characterize the physical design 252 such as memories, flash memories, system on chip designs, or particular process technology being designed to in physical design 252, or a particular cell library used in physical design 252, or any other common characteristics that may form different sets of slightly different patterns in mask design 256. The stencil can include a set of characters, such as a limited number of characters that was determined in the step 258, including a set of adjustment characters. Once the stencil is completed the stencil is used in a charged particle beam writer system, such as an electron beam system, to form a pattern on the surface of a reticle in step 262. Each shot of the charged particle beam writer system may have a specified magnification. After the image is formed on the reticle, the reticle undergoes various processing steps 263 through which it becomes a photomask 264. The photomask may then be used in an optical lithography machine, which is shown in a step 266. Finally, in a step 268, a substrate such as a silicon wafer is produced. As has been previously described, characters in a CP library 270 may be provided to the OPC step 254 or the MDP step 258. The CP library 270 also provides characters to a character and stencil design step 272 or a glyph generation step 274. The character and stencil design step 272 provides input to the stencil step 260 and to the CP character library 270. The glyph generation step 274 provides information to a glyphs or parameterized glyphs library 276. Also, as has been discussed, the glyphs or parameterized glyphs library 276 provides information to the OPC step 254 or the MDP step 258.

It should be understood throughout this disclosure that the range of CP character magnifications available in the reduction lens of a charged particle beam writer system is contemplated to be less than one. Therefore in this disclosure the words magnification and de-magnification refer to the same operation.

Throughout this disclosure the terms "calculate" and "calculation" may include pre-computation, table look-up, constructive algorithms, greedy algorithms, and iterative improvement methods, in addition to normal deterministic methods such as an equation.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present variable magnification charged particle beam writer system and methods for fracturing and for forming patterns using such a system may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Thus, it is intended that the present subject matter covers such modifications and variations as come within the scope of the appended claims and their equivalents.

What is claimed is:

1. A method for fracturing or mask data preparation (MDP) or optical proximity correction (OPC) comprising:
   inputting patterns to be formed on a surface;
   determining a set of shots of character projection characters to form the patterns, wherein a magnification variation for a plurality of shots in the set of shots is calculated; and
   outputting the magnification variation information for the plurality of shots.

2. The method of claim 1 wherein the magnification variation may be separately assigned for different axes.

3. The method of claim 1 further comprising determining a dosage for each shot in the set of shots.

4. The method of claim 1 wherein the magnification variation for each shot in the set of shots is calculated.

5. A method for forming a pattern on a surface comprising:
   using a charged particle beam writer system having a stencil mask for forming the pattern on the surface;
   inputting a set of shots, wherein each shot has a magnification variation; and
   varying the magnification of the charged particle beam writer system from shot to shot.

6. The method of claim 5 wherein the magnification variation along one axis of the charged particle beam writer system may be different from the magnification variation along a different axis of the charged particle beam writer system.

7. The method of claim 5 wherein each shot in the set of shots further comprises a shot dosage.

8. A method for manufacturing an integrated circuit using an optical lithographic process, the optical lithographic process using a reticle, the method comprising:
   using a charged particle beam writer system having a stencil mask for forming a pattern on the reticle;
   inputting a set of shots to be used to form the pattern on the reticle, wherein each shot has a magnification variation; and
   varying the magnification of the charged particle beam writer system from shot to shot.

9. The method of claim 8 wherein the magnification variation along one axis of the charged particle beam writer system may be different from the magnification variation along a different axis of the charged particle beam writer system.

10. The method of claim 8 wherein each shot in the set of shots further comprises a shot dosage.

11. A method for manufacturing an integrated circuit, the integrated circuit having a surface, the method comprising:
    using a charged particle beam writer system having a stencil mask for forming a pattern on the surface;
    inputting a set of shots to be used to form the pattern on the surface, wherein each shot has a magnification variation; and
    varying the magnification of the charged particle beam writer system from shot to shot.

12. The method of claim 11 wherein the magnification variation along one axis of the charged particle beam writer system may be different from the magnification variation along a different axis of the charged particle beam writer system.

* * * * *